United States Patent [19]

Ito et al.

[11] Patent Number: 4,486,461
[45] Date of Patent: Dec. 4, 1984

[54] METHOD AND APPARATUS FOR GAS PHASE TREATING SUBSTRATES

[75] Inventors: Takashi Ito, Kawasaki; Ichiro Kato, Machida, both of Japan

[73] Assignee: Fujitsu Limited, Kawasaki, Japan

[21] Appl. No.: 476,551

[22] Filed: Mar. 16, 1983

[30] Foreign Application Priority Data

Mar. 16, 1982 [JP] Japan ................................ 57-042456

[51] Int. Cl.³ ............................ B05D 3/06; B05B 5/00
[52] U.S. Cl. ........................................ 427/38; 427/39; 427/46; 427/55; 118/620; 118/50.1; 118/641; 219/10.57
[58] Field of Search ................ 427/38, 39, 55, 45.1, 427/46; 118/620, 50.1, 641; 219/10.57, 10.79, 10.49 R

[56] References Cited

U.S. PATENT DOCUMENTS

| | | | |
|---|---|---|---|
| 4,298,629 | 11/1981 | Nozaki et al. | 427/39 |
| 4,339,645 | 7/1982 | Miller | 118/50.1 |
| 4,401,689 | 8/1983 | Ban | 427/45.1 |

OTHER PUBLICATIONS

Chittick et al., The Preparation and Properties of Amorphous Silicon, Solid State Science, Jan. 1969, pp. 77–81.

*Primary Examiner*—John E. Kittle
*Assistant Examiner*—James J. Seidleck
*Attorney, Agent, or Firm*—Staas & Halsey

[57] ABSTRACT

Despite the short lifetime of excited plasma gas, a very large number of wafers can be uniformly gas phase treated in the plasma state by using a single high frequency power supply coil or capacitor, not only for exciting reaction gas passing near the wafers in a reaction tube but also for heating radiators, surrounding the substrates, which heat the wafers.

13 Claims, 6 Drawing Figures

METHOD AND APPARATUS FOR GAS PHASE TREATING SUBSTRATES

BACKGROUND OF THE INVENTION

1. Field of the Invention

The present invention relates to a method and apparatus for gas phase treating substrates, in particular, a method and apparatus which can treat a large number of substrates in a single operation.

2. Description of the Prior Art

In one prior art gas phase treatment system, substrates to be treated, such as silicon wafers, are supported on a holder of, e.g., quartz and inserted in a reaction tube of quartz. The reaction tube is covered with a cover having a gas inlet port. A reaction gas is fed into the reaction tube from an inlet port and is evacuated through an outlet port, so as to reduce the pressure in the tube to a required level. The substrates are heated by an electrical resistance heater or the like. The reaction gas flowing from the inlet to the outlet is excited by a work coil near the inlet to the plasma state. The excited plasma gas reaches the substrates to be treated, which are heated to a reaction temperature, and treats, for example, deposits on the substrates.

In this system, however the various substrates are located at different distances from where the reaction gas is excited. This makes it difficult to supply active reaction seeds uniformly to all substrates. Therefore, a large number of substrates cannot be treated in a single operation. Further, the lifetime of the excited state of the reaction gas is limited. If the lifetime is too short, active reaction seeds may sometimes reach no substrates.

In an improved prior art system, substrates are held by susceptors made of carbon coated with a silicon nitride (SiC) film and arranged in parallel to each other in a reaction tube, and the tube is surrounded by a work coil at the portion where the susceptors and substrates are placed. Details of this system are described in Nozaki et al., U.S. Pat. No. 4,298,629. In this system, the work coil not only induction heats the susceptors, which heat the substrates by heat conduction, but also excites the reaction gas flowing near the susceptors and substrates. Therefore, the various substrates are all located close to where the reaction gas is excited, so the excited reaction gas can uniformly reach the substrates in the excited state.

A susceptor of, e.g., SiC coated carbon, however, has a low electrical resistance and, therefore, easily carries induction currents, inhibiting excitation of the reaction gas nearby. This makes it necessary to space susceptors holding substrates at a certain distance, decreasing the number of substrates which can be treated in the system in a single operation. Further, disturbances of the electromagnetic field by the work coil, the disturbances being caused by the susceptors, make it difficult to uniformly treat the entire surface of substrates held on the susceptors. Still further, susceptors often tend to be deteriorated by a reaction gas in a reaction tube.

SUMMARY OF THE INVENTION

An object of the present invention is to resolve the above-mentioned problems in the prior art.

Another object of the present invention is to provide a method and apparatus which enables uniform gas phase treatment of a large number of substrates in a single operation.

These and other objects, features, and advantages of the invention are accomplished by a method for gas phase treating a substrate, comprising: receiving a substrate to be treated in a reaction tube; exciting the reaction gas to the plasma state by a means for supplying high frequency power; and heating a radiator surrounding the substrate by the high frequency power supply means. The radiator heats the substrate, so that the substrate is treated by the reaction gas in the plasma state.

In this method, the reaction gas is excited at a place near each of the substrates, and the substrates can be arranged in parallel and very close to each other, since there are no susceptors or other conductive bodies in the reaction tube. As a result, a large number of substrates can be treated uniformly in a single operation. The lifetime of the plasma state of a required reaction gas is therefore not a limiting factor on the number of substrates which can be treated.

Another aspect of the present invention resides in an apparatus for gas phase treating a substrate, comprising: a reaction tube for receiving a substrate, the reaction tube having a gas inlet and outlet port for a reaction gas; a means surrounding the substrate received in the reaction tube for supplying high frequency power to the reaction gas; and a radiator placed between the substrate and the high frequency power supply means for heating the substrate, the radiator itself being heated by the high frequency power supply means.

BRIEF DESCRIPTION OF THE DRAWINGS

The present invention and features and advantages thereof will be better understood by reference to a preferred embodiment and drawings, wherein.

DESCRIPTION OF THE PREFERRED EMBODIMENTS

Before discussing the preferred embodiments, reference is made to the prior art.

Figure 1:
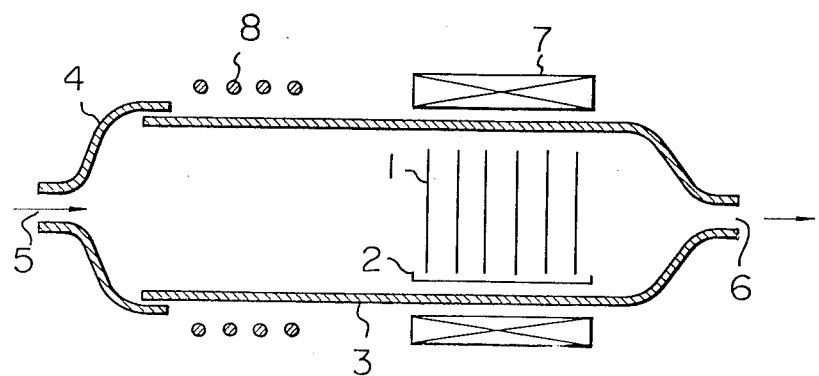
FIG. 1 is a sectional view of a prior art gas phase treatment system.

FIG. 1 shows the prior art gas phase treatment system first mentioned above. Substrates 1, such as silicon wafers, are supported on a holder 2 of, e.g., quartz and inserted in a reaction tube 3 of quartz. The reaction tube 3 is covered with a cover 4 having a gas inlet port 5. A reaction gas is fed into the reaction tube 3 from an inlet port 5 and is evacuated through an outlet port 6 so as to reduce the pressure in the tube 3 to a required level. The substrates 1 are heated by a heater such as an electrical resistance heater 7. The reaction gas flowing from the inlet 5 to the outlet 6 is excited by a work coil 8 near the inlet 5, to the plasma states.

Figure 2:
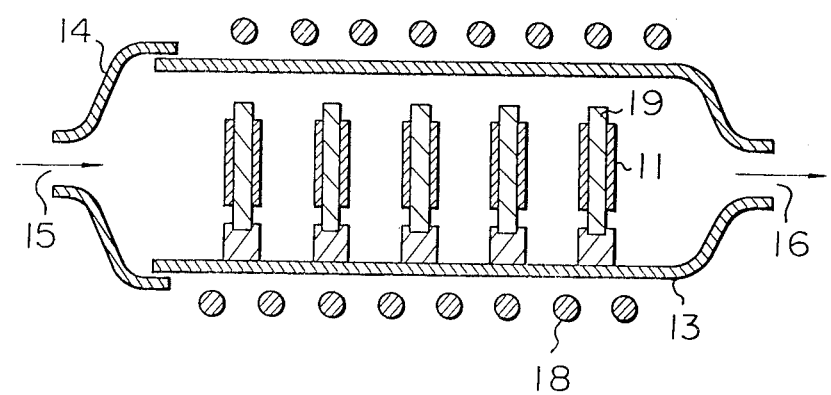
FIG. 2 is a sectional view of an improved prior art gas phase treatment system.

FIG. 2 shows the improved prior art system, in which 11 denotes substrates, 13 a reaction tube, 14 a cover, 15 a gas inlet port, 16 a gas outlet port, 18 a work coil, and 19 SiC coated carbon susceptors.

The method and apparatus for gas phase treating a substrate in accordance with the present invention will now be explained.

Figure 3:
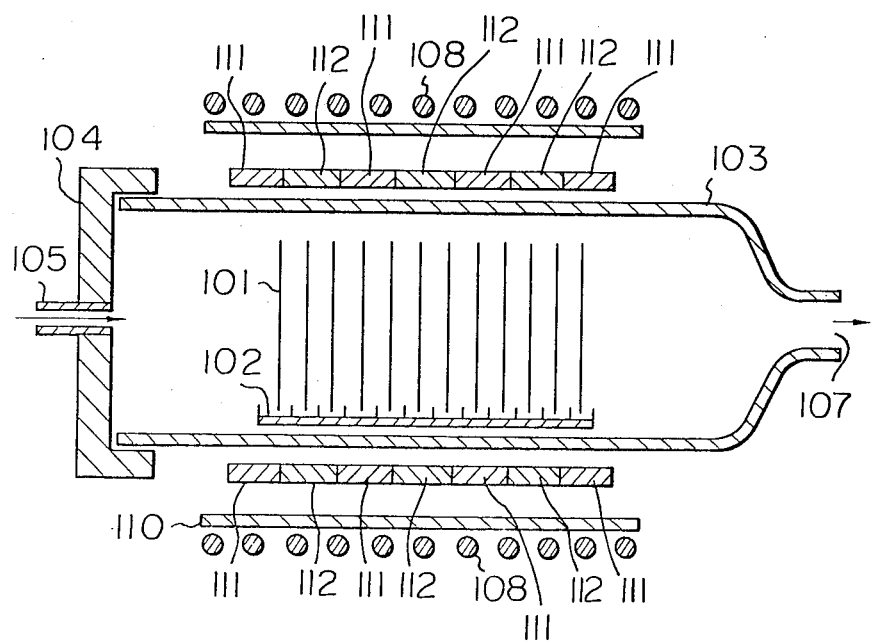
FIG. 3 is a sectional view of an apparatus for gas phase treating a substrate according to the present invention.

FIG. 3 is a sectional view of an apparatus according to an embodiment of the present invention.

The apparatus, for example for direct nitridation of silicon (Si) wafers, can hold 20 silicon wafers (12 shown in FIG. 3) 101 of 3 inches diameter and 500 μm (micrometer) thickness placed in a quartz holder 102 vertically and in parallel to each other at spaces of 5 mm. The holder 102 is placed in a reaction tube 103 of quartz and of 110 mm diameter, 1 m length, and 4 mm thickness. The reaction tube 103 has a quartz cover 104 on one end. A gas inlet port 105 is provided in the quartz cover 104, and a gas outlet port 107 is provided in the reaction tube 10 at the opposite end. A 40 cm-long conductor is wound on a support tube 110 around the reaction tube 103 30 times to form a work coil 108. Between the reaction tube 103 and the support tube 110, 10 radiators 111 (4 shown in FIG. 3) of SiC film coated carbon are arranged. Each radiator 111 is in the form of a ring having a 120 mm inner diameter, a 130 mm outer diameter, and a 1 cm width. The 10 radiators 111 are spaced from each other by quartz spacers 112 of 1 cm width.

Purified ammonia ($NH_3$) gas is fed into the reaction tube 103 through the gas inlet port 105 at a rate of 300 $cm^3$/min and is evacuated through the gas outlet port 107 by a vacuum pump (not shown) to create a pressure of 100 to 130 Pa in the reaction tube 103. A high frequency power of 400 kHz, 6.5 kV, and 3 A is supplied to the work coil 108. This high frequency power heats the radiators 111 by induction. This heat is radiated to heat the silicon wafers 101 to a temperature of about 1000° C. at their centers. The temperature of the silicon wafers 101 is as uniform as when heated by a conventional electrical resistance heater.

Part of the high frequency power supplied to the work coil 108 passes through the quartz spacers 112 to reach inside the reaction tube 103 and excite the ammonia gas, thereby decomposing the gas into nitrogen and hydrogen ions. The thus excited states have extremely short lifetimes, but the excited nitrogen ions reach the surfaces of the silicon wafers 101 due to the proximity between the place where the nitrogen ions are produced and the surfaces of the wafers. The nitrogen ions react with the silicon to form a silicon nitride (SiN) film at the surface of the silicon wafers 101.

In an actual experiment, the above treatment was continued for a period of 30 minutes to 1 hour to obtain aa silicon nitride film having a thickness of 40 Å. The thickness of the resultant silicon nitride film was determined at the center and four peripheral points of the eight center wafers of the 20 wafers inserted in the reaction tube 103.

The thickness at the center points is set forth in Table 1, in which the thicknesses are relative values.

TABLE 1

| Film Thickness Distribution Between Wafers | |
| --- | --- |
| Wafer No. | Wafer center thickness (Relative value) |
| 1 | 106 |
| 2 | 97 |

TABLE 1-continued

| Film Thickness Distribution Between Wafers | |
| --- | --- |
| Wafer No. | Wafer center thickness (Relative value) |
| 3 | 97 |
| 4 | 95 |
| 5 | 93 |
| 6 | 87 |
| 7 | 93 |
| 8 | 97 |

Figure 4:
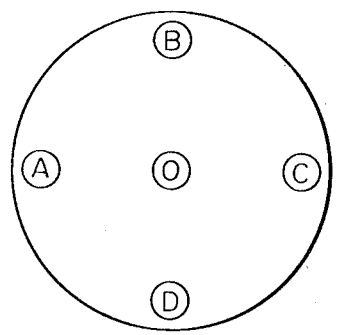
FIG. 4 is a plan view of a wafer illustrating points where the thicknesses are measured.

The four peripheral points were the points illustrated by marks A, B, C, and D in FIG. 4. The thicknesses at these points were evaluated as relative to the thickness at the center point 0 and are set forth in Table 2.

TABLE 2

| Film Thickness Distribution in the Wafers | | | | | |
| --- | --- | --- | --- | --- | --- |
| Wafer No. | Measured Point | | | | |
| | 0 | A | B | C | D |
| 1 | 100 | 112 | 94 | 99 | 105 |
| 2 | 100 | 103 | 103 | 101 | 101 |
| 3 | 100 | 103 | 109 | 100 | 98 |
| 4 | 100 | 98 | 106 | 98 | 101 |
| 5 | 100 | 100 | 104 | 98 | 98 |
| 6 | 100 | 105 | 107 | 96 | 99 |
| 7 | 100 | 102 | 101 | 97 | 104 |
| 8 | 100 | 115 | 97 | 96 | 97 |

As can be seen from Tables 1 and 2, the thicknesses of the resultant silicon nitride film are uniform between wafers and in each wafer within the tolerance for practical uses. In comparison, zero or only one substrate with silicon nitride film having the film thickness within the tolerance can be obtained by the prior art method described before with reference to FIG. 1 since the lifetime of the plasma gas excited from ammonia is extremely short. Further, in the method described before with reference to FIG. 2, susceptors, each holding two silicon wafers, should be spaced at an approximately 4 cm distance. The resulting film thickness is therefore less uniform in a wafer and the number of wafers treatable in a single operation is smaller than in the present invention.

It is obvious that more than eight wafers can be treated uniformly just by making the length of the apparatus longer.

Figure 5:
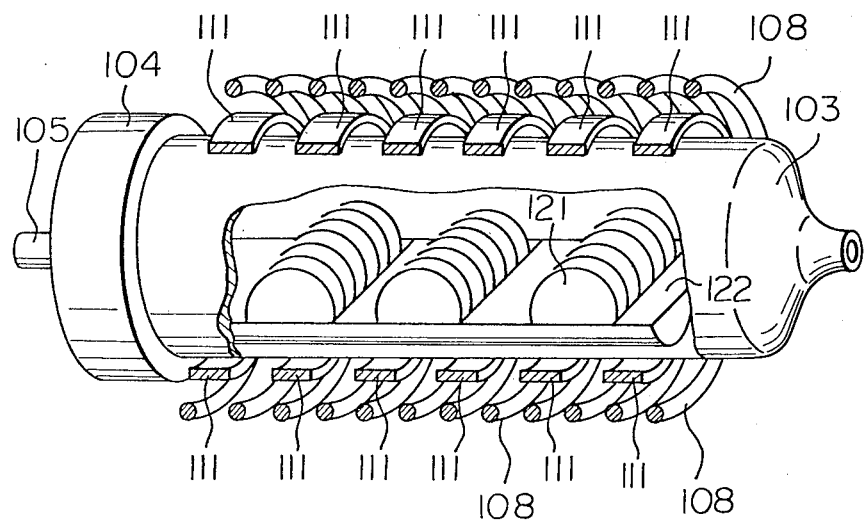
FIG. 5 is a partially cut-away perspective view of another apparatus for gas phase treating a substrate according to the present invention.

While in the above-mentioned embodiment of the present invention, silicon wafers are arranged such that the main surfaces of the wafers are perpendicular to the longitudinal axis of the reaction tube, the main surfaces of wafers may be arranged in parallel to that axis of the reaction tube as shown in FIG. 5. FIG. 5 illustrates such an arrangement of wafers in a reaction tube. In this embodiment of the present invention, the apparatus and operation are the same as in the above-mentioned embodiment except that silicon wafers 121 held by a holder 122 are arranged vertically and in parallel to each other and to the axis of the reaction tube 103. Further, the main surfaces of the wafers may be placed in other orientations in a reaction tube.

A silicon epitaxial layer can also be grown by basically the same method and apparatus described above, but by feeding silicon tetrachloride gas diluted with hydrogen gas into the reaction tube instead of purified ammonia. The excited silicon tetrachloride gas easily decomposes and silicon atoms are bound with the silicon wafers to form an epitaxial layer on the wafers. The epitaxial layers thus formed are uniform in thickness on each wafer and between the wafers.

Basically the same method and apparatus as above can be also advantageously effected for other treatments, for example, plasma oxidation of the surface of a silicon wafer, since means for heating silicon wafers, i.e., radiators 111 in FIG. 3, are outside the reaction tube 103. If inside, the means would be exposed to the plasma gas, resulting in deterioration. In the case of plasma oxidation, the space between the radiators is 2 cm, not 1 cm; oxygen gas is fed into the reaction tube 103 and evacuated therefrom; high frequency power of 400 kHz, 6.5 kV, and 3.9 A is supplied; and the temperature of the silicon wafers is elevated to 900° C. The resultant silicon oxide film increases in thickness to 90 Å after a 60 minute treatment and to 133 Å after a 160 minute treatment.

Figure 6:
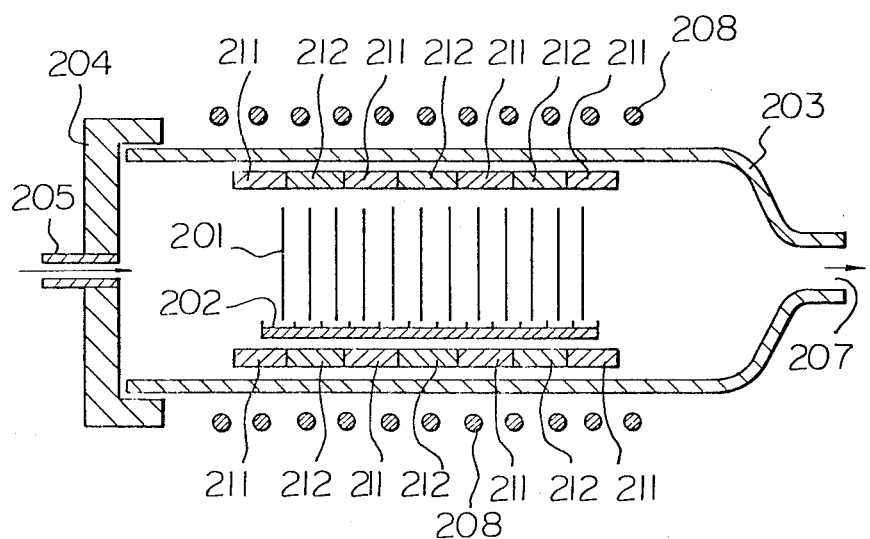
FIG. 6 is a sectional view of a still further apparatus for gas phase treating a substrate according to the present invention.

However, radiators heated by a high frequency power supply means and for heating wafers may be provided either outside a reaction tube or inside a reaction tube. FIG. 6 illustrates the latter system. In FIG. 6, 201 denotes a wafer, 202 a holder, 203 a reaction tube, 204 a cover, 205 a gas inlet port, 207 a gas outlet port, and 208 a work coil. Radiators 211 of, e.g., SiC coated carbon and spacers 212 of, e.g., quartz are arranged between the wafers 201 received in the reaction tube 203 and the work coil 208 but inside the reaction tube 203, not outside. In this system, the advantage of the present invention of uniform treatment of a large number of wafers in a single operation, is also attained. The disadvantage of deterioration of radiators may not occur in the case of certain reaction gases.

It will be understood that the present invention is not limited to the above embodiments and that modifications are possible within the spirit of the invention. For example, the means for supplying high frequency power may be of the capacitor type instead of the induction type. Further, the invention may be advantageously applied for CVD of metal or oxide film, plasma etching treatment and other treatment of substrate in which plasma gas and an elevated temperature are used in addition to nitridation of silicon, epitaxial growth, and plasma oxidation.

We claim:

1. A method for gas phase treating a plurality of substrates, comprising:
   (a) receiving a plurality of substrates in a reaction tube;
   (b) feeding a reaction gas into the reaction tube;
   (c) exciting the reaction gas to a plasma state by a means for supplying high frequency power; and
   (d) heating a radiator, including a plurality of radiator elements, spaced apart from and surrounding the substrates by the high frequency power supply means, the radiator heating the substrates by radiation, the substrates being treated by the reaction gas in the plasma state.

2. A method according to claim 1, wherein said step (d) includes placing the radiator outside the reaction tube.

3. A method according to claim 1, wherein said step (d) includes placing the radiator inside the reaction tube.

4. A method according to claim 1, wherein said step (a) comprises arranging the plurality of substrates vertically and spaced parallel to each other.

5. A method according to claim 4, wherein said step (a) further comprises arranging the plurality of substrates perpendicularly with respect to the longitudinal axis of the reaction tube.

6. A method according to claim 4, wherein said step (a) further comprises arranging the plurality of substrates in parallel to the longitudinal axis of the reaction tube.

7. A method according to claim 1, wherein at least one surface of each of the substrates is directy nitridated.

8. An apparatus for gas phase treating a plurality of substrates using a reaction gas, comprising:
   a reaction tube for receiving the substrates to be treated, said reaction tube having a gas inlet port and a gas outlet port for the reaction gas;
   means, surrounding the substrates received in said reaction tube, for supplying high frequency power to the reaction gas, said high frequency power supply means comprising a work coil;
   a radiator, placed between the substrates and said high frequency power supply means, and spaced apart from the substrates, for heating the substrates, said radiator being heated by said high frequency power supply means, said radiator comprising a plurality of carbon-based rings spaced apart from each other and positioned between said reaction tube and said work coil.

9. An apparatus for gas phase treating substrates using a reaction gas, comprising:
   a reaction tube in which the substrates to be treated are positioned, said reaction tube having an inlet and an outlet for the reaction gas;
   radiators positioned adjacent the substrates, said radiators spaced apart from the substrates and spaced apart from one other; and
   a high frequency power supply, positioned adjacent said radiators, for exciting the reaction gas and for heating said radiators, said radiators being positioned between the substrates and said high frequency power supply, said radiators radiating heat to heat the substrates.

10. An apparatus according to claim 9, wherein said radiators each comprise an SiC film coated carbon ring.

11. An apparatus according to claim 10, further comprising spacers, positioned between said radiator rings, for maintaining said radiator rings spaced from one another.

12. An apparatus according to claim 11, wherein said spacers are quartz spacers.

13. An apparatus according to claim 11, wherein said high frequency power supply comprises a work coil.

* * * * *